(12) United States Patent
Liu et al.

(10) Patent No.: US 8,816,741 B2
(45) Date of Patent: Aug. 26, 2014

(54) STATE RETENTION POWER GATED CELL

(71) Applicants: Yifeng Liu, Suzhou (CN); Zhe Chen, Suzhou (CN); Shayang Zhang, Tianjin (CN); Jian Zhou, Suzhou (CN)

(72) Inventors: Yifeng Liu, Suzhou (CN); Zhe Chen, Suzhou (CN); Shayang Zhang, Tianjin (CN); Jian Zhou, Suzhou (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/965,202

(22) Filed: Aug. 13, 2013

(65) Prior Publication Data
US 2014/0118046 A1 May 1, 2014

(30) Foreign Application Priority Data

Oct. 26, 2012 (CN) .......................... 2012 1 0551411

(51) Int. Cl.
*H03K 3/356* (2006.01)
*H03K 3/012* (2006.01)

(52) U.S. Cl.
CPC ..................... *H03K 3/012* (2013.01)
USPC ........................................................ 327/212

(58) Field of Classification Search
CPC .................................................. H03K 3/35606
USPC ................................................................ 327/212
See application file for complete search history.

(56) References Cited

U.S. PATENT DOCUMENTS

| 7,138,842 | B2 | 11/2006 | Padhye |
| 7,164,301 | B2 | 1/2007 | Chun |
| 7,583,121 | B2 * | 9/2009 | Berzins et al. ................ 327/202 |
| 7,791,389 | B2 | 9/2010 | Remington |
| 8,330,518 | B2 | 12/2012 | Veggetti |

* cited by examiner

*Primary Examiner* — Daniel Rojas
(74) *Attorney, Agent, or Firm* — Charles Bergere

(57) ABSTRACT

A state retention power gated (SRPG) cell includes an input control circuit having an input coupled to an input signal and an output. The input control circuit includes has transistors configured as a first inverter transmission gate. The transistors also connect in series at least one transistor controlled by a power gating signal. A first latch has an input coupled to the output of the input control circuit and an output. A transmission gate has an input coupled to the output of the first latch and an output that is an output of the SRPG cell. A second latch has an input coupled to the output of the transmission gate and an output that also is an output of the SRPG cell. A second inverter transmission gate has an input coupled to the output of the second latch.

13 Claims, 5 Drawing Sheets

STATE RETENTION POWER GATED CELL

BACKGROUND OF THE INVENTION

The present invention relates generally to integrated circuits and, more particularly, to state retention power gated (SRPG) cells used in integrated circuits.

Lower power consumption has been gaining importance in integrated circuit data processing systems due to, for example, wide spread use of portable and handheld devices. Most circuits in handheld devices are typically off (e.g., in an idle or deep sleep mode) for a significant portion of time, consuming only leakage power. As transistor leakage currents increase with finer geometry manufacturing processes, it becomes more difficult to meet chip leakage targets using traditional power reduction techniques. Therefore, reducing leakage current is becoming an increasingly important factor in extending battery life.

One method that has been used to reduce leakage current is to "power gate", or cut off power for certain blocks of the integrated circuit that are not needed when the device, such as when the device is in a low power or sleep mode. However, in doing so, the state of the circuit is lost if a means is not provided to retain the state during the powered down mode. Therefore, a SRPG cell is provided which has at least one separate latch to retain the logic state of the cell during power down mode.

In low power designs, there are two classic kinds of SRPG cells: clock state independent (CSI) SRPG cells and non-CSI SRPG cells. Non-CSI SRPG cells are smaller in size and consume less power than CSI SRPG cells, but have specific clock state requirements. For positive edge triggered non-CSI SRPG cells, the clock needs to be held low during the assertion/de-assertion of a power gating signal, while for negative edge triggered non-CSI SRPG cells, the clock needs to be held high during the assertion/de-assertion of a power gating signal.

Therefore, in existing designs, only flip-flops that meet the above non-CSI SRPG clock state requirements are replaced with non-CSI SRPG cells. The others have to be replaced with CSI SRPG cells, which are large in size and consume more power.

Therefore it would be desirable to improve the SRPG cells to solve the above problems.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying Figures, in which like references indicate similar elements.

DETAILED DESCRIPTION OF THE INVENTION

Figure 1:
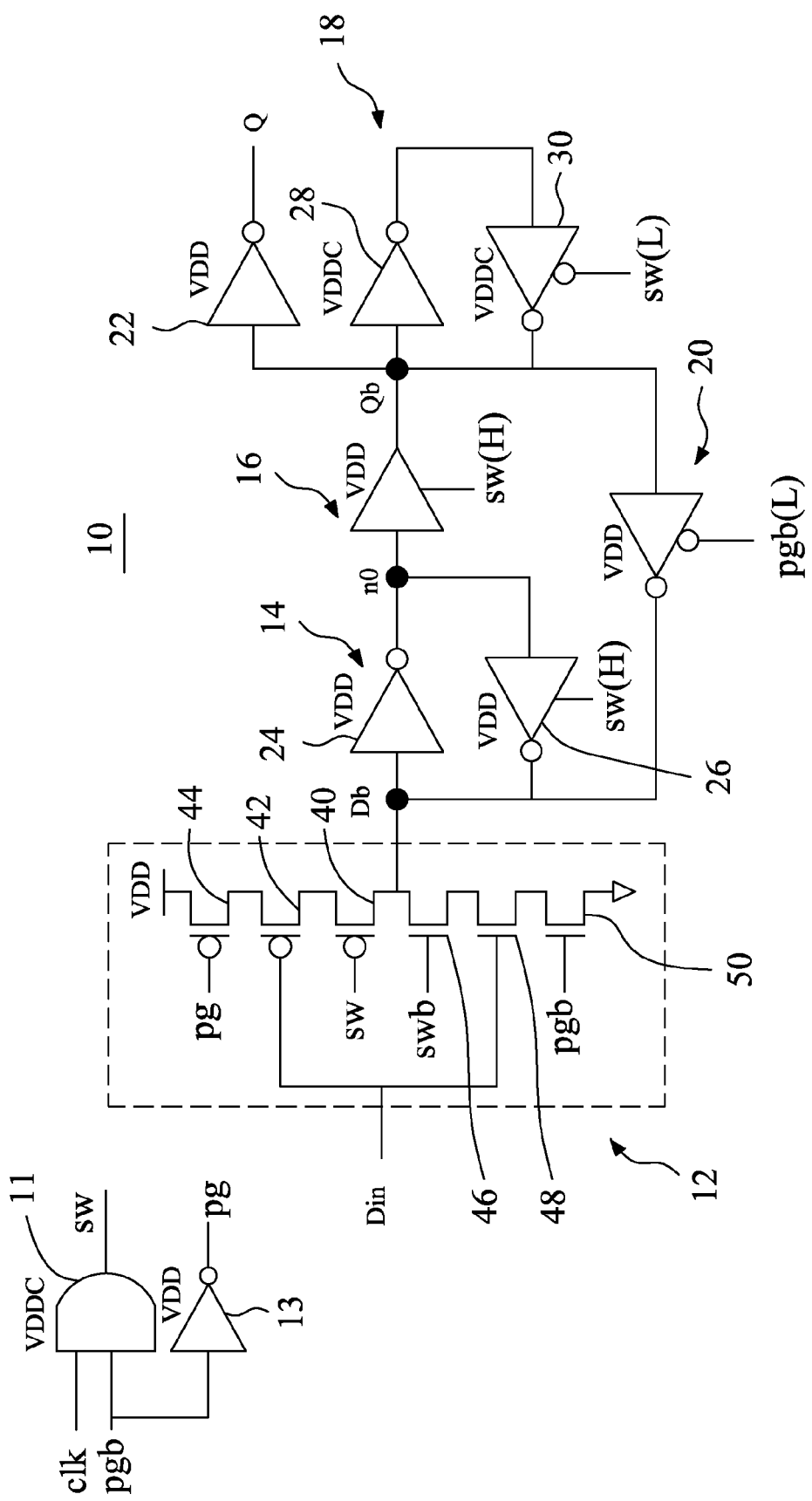
FIG. 1 is a schematic circuit diagram of a SRPG cell in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

Considering the disadvantages of current non-CSI SRPG cells and CSI SRPG cells, novel SRPG cells that can optimize the die area and power consumption are desirable. Embodiments of the present invention create such SRPG cells including novel CSI SRPG cells and novel non-CSI (CSD, Clock State Dependent) SRPG cells. The SRPG cells according to embodiments of the present invention can save die area and power consumption. The non-CSI SRPG cells according to embodiments of the present invention are adaptable for positive edge-clock-triggered CSI SRPG cells, while the clock is held high during assertion/de-assertion of a power gating signal; and negative edge-clock-triggered non-CSI SRPG cells, while the clock is held low during assertion/de-assertion of a power gating signal.

In one embodiment, the present invention provides a CSI SRPG cell having an input control circuit, a first latch, a transmission gate, a second latch and a second inverter transmission gate. The input control circuit has an input coupled to an input signal and an output, and the input control circuit includes a plurality of transistors configured to be a first inverter transmission gate. The transistors further serially connect at least one transistor controlled by at least one power gating signal. The first latch has an input coupled to the output of the input control circuit and an output. The transmission gate has an input coupled to the output of the first latch and an output to be at least one output of the SRPG cell. The second latch has an input coupled to the output of the transmission gate and an output to be at least one output of the SRPG cell. The second inverter transmission gate has an input coupled to the output of the second latch.

In another embodiment, the first inverter transmission gate is controlled by at least one control signal obtained by a logic operation of a clock signal and the at least one power gating signal. The input control circuit includes first through third P-channel transistors, and first through third N-channel transistors. The P-channel and N-channel transistors are connected in series. The gate of the first P-channel transistor is coupled to receive a first control signal, and the gate of the first N-channel transistor is coupled to receive a second control signal that is a complement of the first control signal. The gate of the third P-channel transistor is coupled to receive a first power gating signal, and the gate of the third N-channel transistor is coupled to receive a second power gating signal that is a complement of the first power gating signal; the gate of the second P-channel transistor is coupled to receive the input signal, and the gate of the second N-channel transistor is coupled to receive the input signal. The first control signal is obtained by a logic AND operation of the clock signal and the second power gating signal.

According to another embodiment of the present invention, the input control circuit includes a first P-channel transistor, a second P-channel transistor, a first N-channel transistor, a second N-channel transistor, and a third N-channel transistor. The second P-channel transistor, the first P-channel transistor, the first N-channel transistor, the second N-channel transistor and the third N-channel transistor are sequentially serial-connected. The gate of the first P-channel transistor is coupled to receive a first control signal, and the gate of the first N-channel transistor is coupled to receive a second control signal, the second control signal is a complement of the first control signal. The gate of the third N-channel transistor is coupled to receive a second power gating signal. The gate of the second P-channel transistor is coupled to receive the input signal, and the gate of the second N-channel transistor is coupled to receive the input signal.

An embodiment of the present invention provides a SRPG cell, including an input control circuit, a first latch, a second latch, a second transmission gate and an inverter transmission gate. The input control circuit has an input coupled to an input signal and an output, and the input control circuit is a first transmission gate only controlled by a clock signal. The first latch has an input coupled to the output of the input control circuit and an output. The second transmission gate has an input coupled to the output of the first latch and an output to be at least one output of the SRPG cell. The second latch has an input coupled to the output of the transmission gate and an output to be at least one output of the SRPG cell. The inverter transmission gate has an input coupled to the output of the second latch.

In another embodiment of the present invention, for a positive edge clock triggered non-CSI SRPG cell, the clock signal is held high during assertion/de-assertion of a power gating signal, and the input control circuit is disabled. For a negative edge-clock-triggered non-CSI SRPG cell, the clock signal is held low during assertion/de-assertion of a power gating signal, and the input control circuit is disabled.

An embodiment of the present invention further provides a control method for a non-CSI SRPG cell, comprising: controlling an input control circuit using only a clock signal, the input control circuit having an input coupled to an input signal and an output, wherein the input control circuit is a first transmission gate; controlling a first latch using a control signal, the first latch having an input coupled to the output of the input control circuit and an output; controlling a second transmission gate using the control signal, the second transmission gate having an input coupled to the output of the first latch and an output to be at least one output of the non-CSI SRPG cell; controlling a second latch using the control signal, the second latch having an input coupled to the output of the second transmission gate and an output to be at least one output of the non-CSI SRPG cell; and controlling an inverter transmission gate using a power gating signal, the inverter transmission gate having an input coupled to the output of the second latch.

The present invention is advantageous in SRPG cells with same functionality but smaller area, lower power consumption, reduced clock load, and improved setup/hold time margin variations.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiments disclosed may be readily used as a basis for modifying or designing other structures or processes for carrying out the same purposes of the present invention. It should also be realized by those skilled in the art that such equivalent constructions do not depart from the spirit and scope of the invention as set forth in the appended claims.

Referring now to FIG. 1, a schematic circuit diagram of an SRPG cell 10 in accordance with an embodiment of the present invention is shown. The SRPG cell 10 is an improved CSI SRPG cell that is controlled asynchronously with a pair of power gating signals that are logical complements of each other. The CSI SRPG cell 10 includes an input control circuit 12, a first latch 14, a transmission gate 16 controlled by a first control signal "sw", a second latch 18, and a second inverter transmission gate 20 controlled by a second power gating signal "pgb". In the following description, a "b" following a signal name indicates that the signal is a logical complement of the signal having the same name but lacking the "b". For example, the second control signal "swb" is the logical complement of the first control signal "sw." In this embodiment, the second control signal "swb" or the second power gating signal "pgb" is active or asserted as a logic low, and is inactive or de-asserted as a logic high. Likewise the first control signal "sw" or the first power gating signal "pg" is active or asserted as a logic high, while is inactive or de-asserted as a logic low.

The control signal "sw" or "swb" is obtained by a logical operation of the clock signal and the power gating signal. In this embodiment, for example, an AND gate 11 receives the clock signal "clk" and the second power gating signal "pgb" and generates the first control signal "sw". The AND gate 11 receives a continuous power supply voltage VDDC. The first power gating signal "pg" is an output of a NOT gate 13 that receives as an input the second power gating signal "pgb". The NOT gate 13 receives an interruptible power supply voltage VDD.

The input control circuit 12 has an input for receiving an input signal "Din", and an output for providing an output coupled to the input of the first latch 14, which is also equivalently indicated as a first node "Db". In this embodiment, the input control circuit 12 further includes a plurality of P-channel transistors 40, 42, and 44, and a plurality of N-channel transistors 46, 48, and 50. The P-channel transistors 40, 42, and 44, and N-channel transistors 46, 48, and 50 are serially connected, wherein the first P-channel transistor 40, the second P-channel transistor 42, first N-channel transistor 46, and the second N-channel transistor 48 are configured to be a first inverter transmission gate, which is controlled by at least one control signal.

Specifically, the first P-channel transistor 40 has a gate coupled to receive the first control signal "sw", a source and a drain coupled to the first node "Db". The second P-channel 42 has a gate coupled to receive the input signal "Din", a source, and a drain coupled to the source of the first P-channel transistor 40. The third P-channel transistor 44 has a gate coupled to receive the first power gating signal "pg", a source coupled to receive the interruptible power supply voltage VDD, and a drain coupled to the source of the second P-channel transistor 42.

The first N-channel transistor 46 has a gate coupled to receive the second control signal "swb", a source, and a drain coupled to the first node "Db." The second N-channel transistor 48 has a gate coupled to receive the input signal "Din", a source, and a drain coupled to the source of the first N-channel transistor 46. The third N-channel transistor 50 has a gate coupled to receive the second power gating signal "pgb", a source coupled to power supply voltage terminal VSS, and a drain coupled to the source of the second N-channel transistor 48.

The first latch 14 includes a first inverter 24 and a third inverter transmission gate 26 controlled by the first control signal "sw." The first inverter 24 and the third inverter transmission gate 26 both receive the interruptible power supply voltage VDD; and has an input coupled to the first node "Db". The first inverter 24 includes an output for providing an output signal to a second node "n0". The third inverter transmission gate 26 has an input coupled to the second node "n0", and an output for providing an output signal to the first node "Db". When the first control signal "sw" is in logic high, the third inverter transmission gate 26 is enabled.

The transmission gate 16 also receives the interruptible power supply voltage VDD, and has an input coupled to the second node "n0" and an output for providing an output to a third node "Qb." When the first control signal "sw" is in logic high, the transmission gate 16 is enabled.

The second latch 18 includes a second inverter 28 and a fourth inverter transmission gate 30 controlled by the first control signal "sw." Being different from the first latch 14, the second inverter 28 and the fourth inverter transmission gate 30 both receive the continuous power supply voltage VDDC. The second inverter 28 has an input coupled to the third node "Qb", and an output. The fourth inverter transmission gate 30 has an input coupled to the output of the second inverter 28, and an output for providing an output signal to the third node "Qb". When the first control signal "sw" is in logic low, the inverter transmission gate 30 is enabled.

The second inverter transmission gate 20 also receives the interruptible power supply voltage VDD, and has an input coupled to the output (i.e., the third node "Qb") of the second latch 18 and an output coupled to the output (i.e., the first node "Db") of the first latch 14. When the second power gating signal "pgb" is in logic low, the second inverter transmission gate 20 is enabled.

The third node label "Qb" may be used as the output of the SRPG cell 10. However, in this embodiment, to obtain an output signal "Q" logically complement that in the first node "Qb", the SRPG cell 10 further includes a third inverter 22 coupled to receive the output signal from the third node "Qb". The third inverter 22 receives the interruptible power supply voltage VDD.

Figure 2:
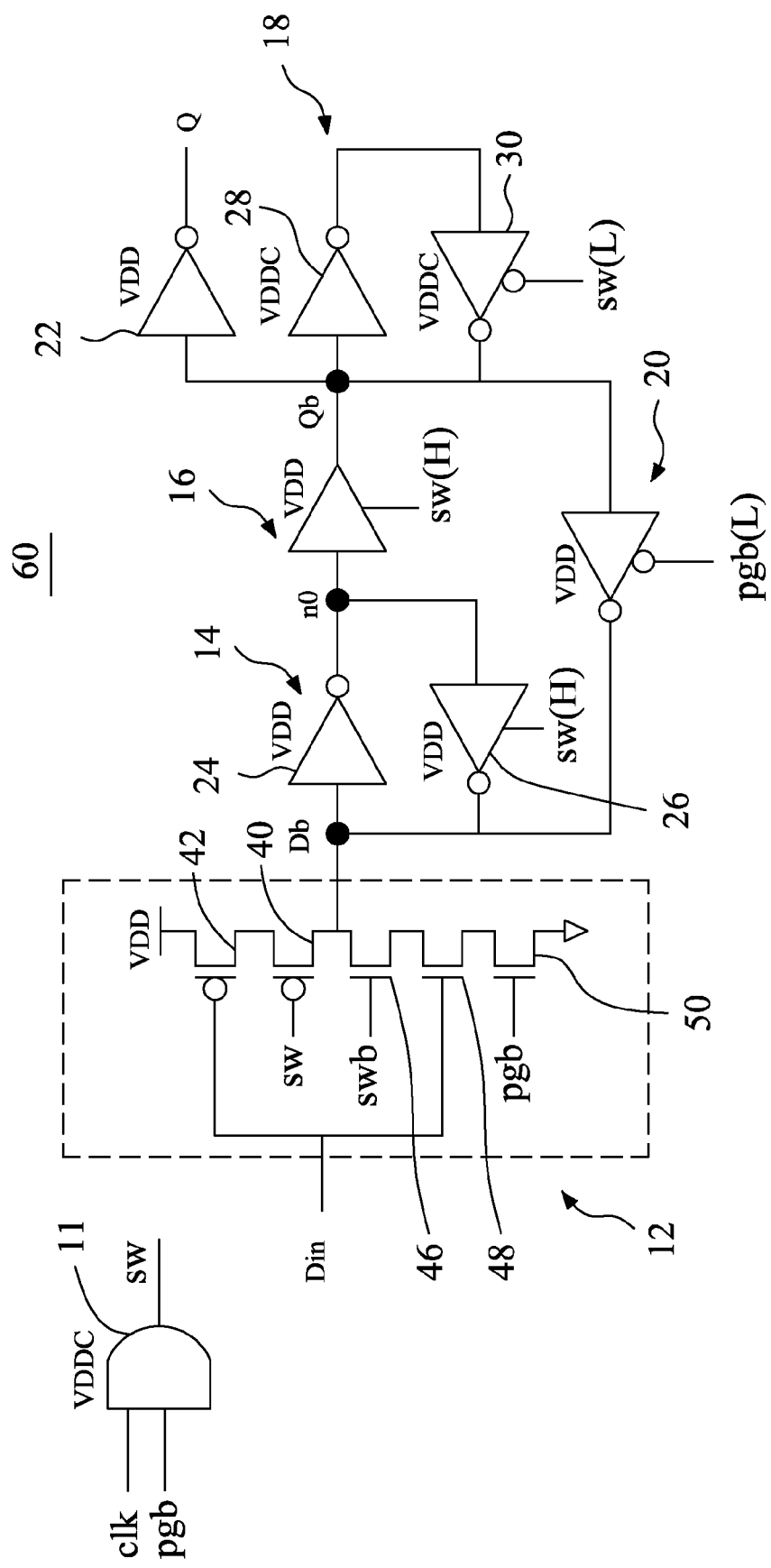
FIG. 2 is a schematic circuit diagram of a SRPG cell in accordance with another embodiment of the present invention.

FIG. 2 is a schematic circuit diagram of an SRPG cell in accordance with an embodiment of the present invention. The SRPG cell 60 shown in FIG. 2 is an synchronously controlled by the second power gating signal "pgb." The third P-channel transistor 44 shown in FIG. 1 is omitted and the source of the second P-channel transistor 42 receives the interruptible voltage VDD. Under the synchronized control of the second power gating signal "pgb," the input signal "Din" has to be stabilized at and after the power gating signal "pgb" asserting low (in the power gated mode).

When the SRPG cell 10, 60 is going to enter the power gated mode, the second power gating signal "pgb" asserts logic low; then the first latch 14 holds data; the input signal "Din" is stable and no toggles happens; the value at the first node "Db" depends on that in the input signal "Din", and contention-free happens on the first node "Db". Thereafter, the interruptible power supply voltage VDD is power down; the third node "Qb" (the output of the SRPG cell 10 and the second latch 18) holds retention state, that is, the input signal "Din", the first node "Db", the second node "n0" will not lost their states and are floating with the interruptible power supply voltage VDD; and in the power gated mode, the SRPG cell 10 and 60 is contention-free.

When the SRPG cell 10 and 60 is going to recover the normal mode from the power gated mode, the interruptible power supply voltage VDD ramps up first while the second power gating signal "pgb" still keep in logic low; then the state of the first latch 14 will restores from the third node "Qb"; still no toggles happen in the input signal "Din"; the state in the first node "Db" is contention-free. Then the second power gating signal "pgb" asserts logic high; and finally, the SRPG cell 10 and 60 restores the normal mode and all components are functional again.

It can be seen that, the improved CSI SRPG cell 10 and 60 of the present invention are advantageous in improved setup time and are contention-free.

For the CSI SRPG cells that meet specific clock state requirements, the present invention further simply them into non-CSI SRPG cells to reduce the die area and power consumption. Wherein, for the CSI SRPG cells that their clock is held high during assertion/deassertion of power gating signal, they are created into positive edge trigger non-CSI SRPG cells; while, for the CSI SRPG cells that their clock is held low during assertion/deassertion of power gating signal, they are created into negative edge trigger non-CSI SRPG cells.

Figure 3:
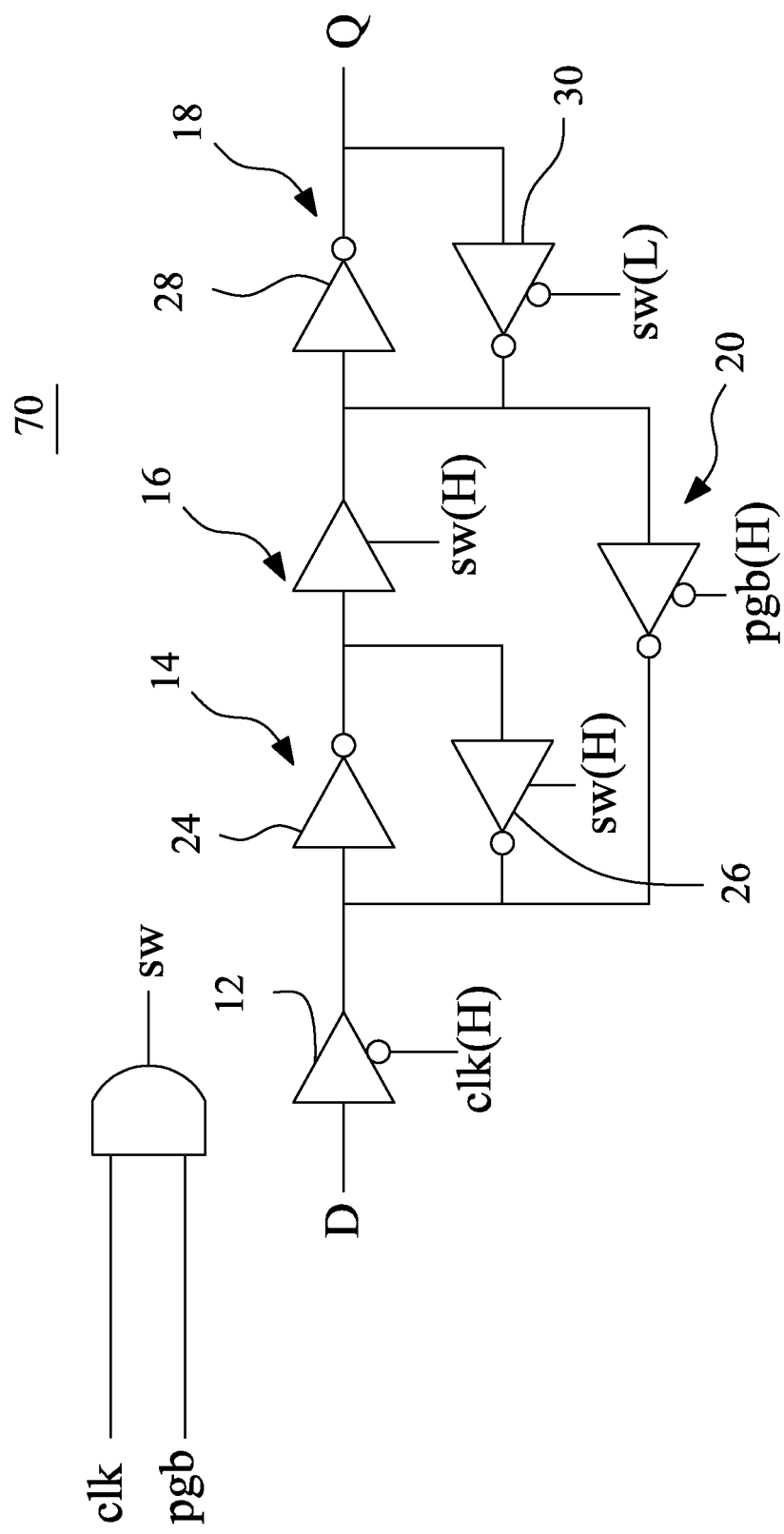
FIG. 3 is a schematic circuit diagram of a positive edge clock triggered non-CSI SRPG cell in accordance with an embodiment of the present invention.
Figure 4:
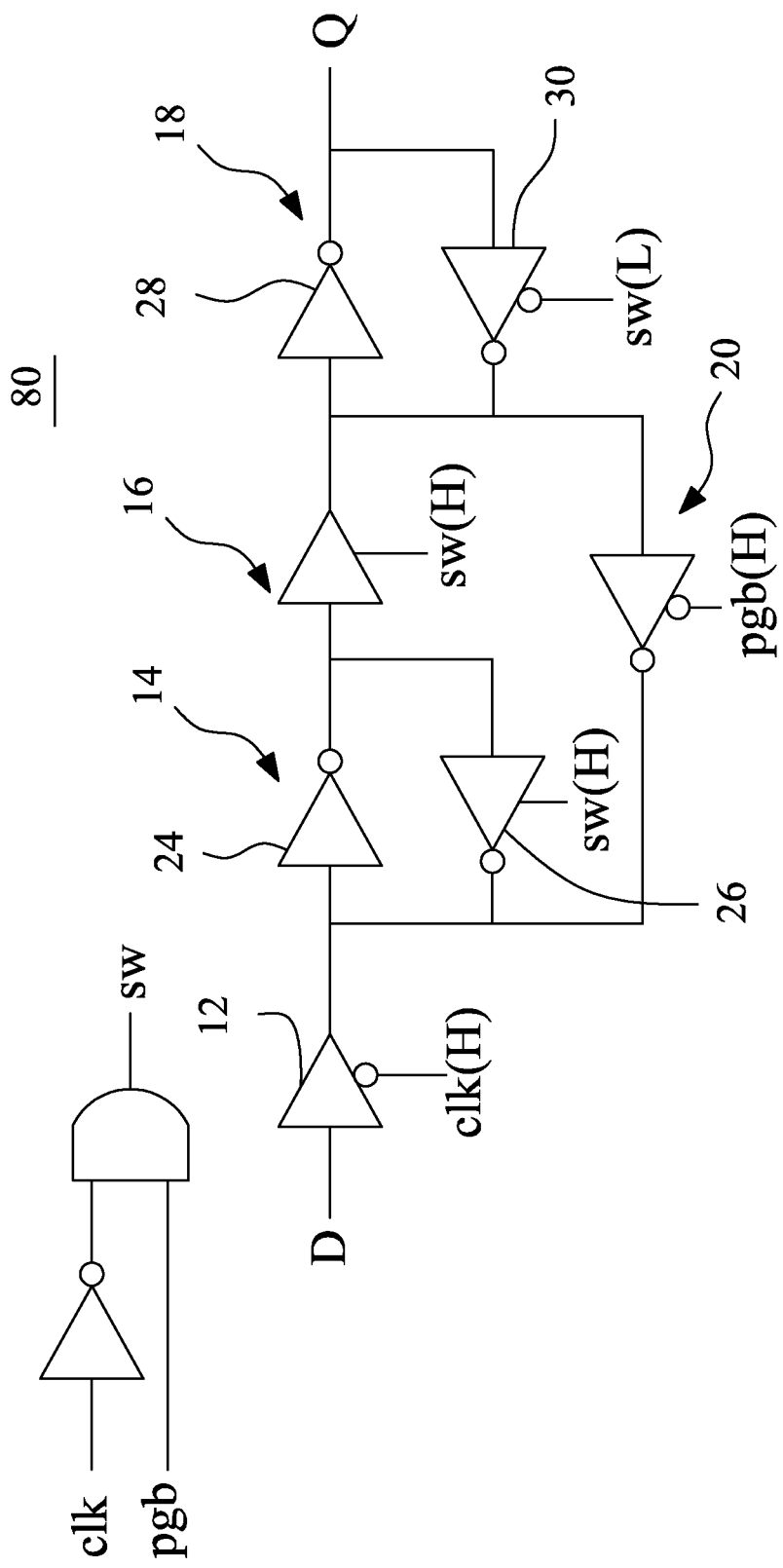
FIG. 4 is a schematic circuit diagram of a negative clock triggered non-CSI SRPG cell in accordance with an embodiment of the present invention.

FIG. 3 is a schematic circuit diagram of a positive edge, clock-triggered non-CSI SRPG cell 70 in accordance with one embodiment of the present invention, while FIG. 4 is a schematic circuit diagram of a negative edge clock-triggered non-CSI SRPG cell 80 in accordance with one embodiment of the present invention.

The non-CSI SRPG cells 70 and 80 shown in FIGS. 3 and 4 both include an input control circuit 12, a first latch 14, a second transmission gate 16 controlled by a first control signal labeled "sw", a second latch 18, and an inverter transmission gate 20 controlled by a second power gating signal "pgb". For simplicity, FIGS. 3 and 4 do not show the power supply information of each component, which is as the same as that shown in FIGS. 1 and 2.

In the positive edge-clock-triggered non-CSI SRPG cell 70 shown in FIG. 3, the input control circuit 12 is a first transmission gate controlled by a clock signal labeled "clk", and has an input for receiving an input signal "D", and an output. Since this non-CSI SRPG cell 70 is positive edge triggered, the input control circuit 12 is enabled when the clock signal "clk" is in logic low. In the case that the non-CSI SRPG cell 10 is negative edge triggered, the input control circuit 12 shown in FIG. 4 is enabled when the clock signal "clk" is in logic high. The first control signal "sw" shown in FIG. 3 is also an output of an "AND" logic gate 11 with an input of the clock signal "clk" and an input of the second power gating signal "pgb". In the case that the non-CSI SRPG cell 70 is negative edge triggered, however, the control signal "SW" is an output of an "AND" logic gate with an input of the inverted clock signal "clk" and an input of the second power gating signal "pgb".

Since the other parts of the non-CSI SRPG cell 70 are as the same as those of the CSI SRPG cell 10 shown in FIGS. 1 and 2, such details are not described again.

Please note that any of the signals described herein can be designed as either negative or positive logic signals. Therefore, in alternate embodiments, those signals described as positive logic signals may be implemented as negative logic signals, and those signals described as negative logic signals may be implemented as positive logic signals. That is, though the embodiments elaborated in the specification use specific states of the clock signal and control signals, such as "clk", "pgb", persons skilled in the art can understand there are various embodiments of the SRPG cells based on the symmetry structure of the above.

Figure 5:
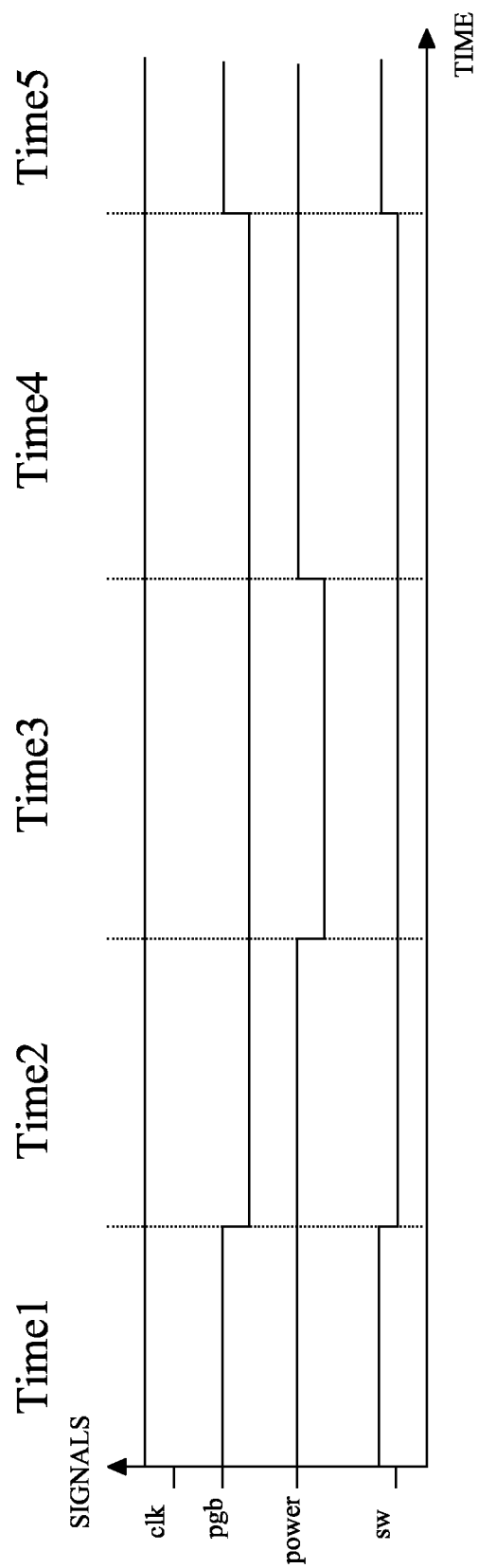
FIG. 5 is a timing diagram of various signals of the non-CSI SRGP cell of FIG. 3.

FIG. 5 is a timing diagram of various signals of the non-CSI SRGP cell 70 in FIG. 3. During time 1, the power is on, and the non-CSI SRPG cell 70 is operating in a normal mode. The clock signal "clk" and the second power gating signal "pgb" are both in logic high, and consequently the first control signal "SW" is in logic high. Thus, the input control circuit 12 controlled by the clock signal "clk" is disabled, the second transmission gate 16, the third inverter transmission gate 26, and the fourth inverter transmission gate 30 controlled by the first control signal "SW" are respectively enabled, enabled, and disabled. The second inverter transmission gate 20 controlled by the second power gating signal "pgb" is disabled. Therefore, the state of the non-CSI SRGP cell 70 is held in the first latch 14.

During time 2, the power is still on, the clock signal "clk" is in logic high, and the second power gating signal "pgb" is asserted low. Thus, the first control signal "SW" is in logic low. The non-CSI SRGP cell 70 begins entering a power gated mode. The input control circuit 12 controlled by the clock signal "clk" is disabled, the second transmission gate 16, the third inverter transmission gate 26, and the fourth inverter transmission gate 30 controlled by the first control signal "SW" are respectively disabled, disabled, and enabled. The second inverter transmission gate 20 controlled by the second power gating signal "pgb" is enabled. Therefore, the state fed from the first latch 14 will be held in the second latch 18.

During time 3, the power supply is changed to be off, the clock signal "clk" is in logic high, and the second power gating signal "pgb" is in logic low. Thus, the first control signal "SW" is in logic low. The SRPG 10 enters a power gated mode. The input control circuit 12 controlled by the clock signal "clk" is disabled, the second transmission gate 16, the third inverter transmission gate 26, and the fourth inverter transmission gate 30 controlled by the first control signal "SW" are respectively disabled, disabled, and enabled. The second inverter transmission gate 20 controlled by the second power gating signal "pgb" is enabled. Therefore, the state of the SRGP cell 10 is held in the second latch 18.

During time 4, the power supply is changed to be on again, the clock signal "clk" is in logic high, and the second power gating signal "pgb" is in logic low. Thus, the first control signal "SW" is in logic low. The non-CSI SRGP cell 10 begins exiting the power gated mode. The input control circuit 12 controlled by the clock signal labeled "clk" is disabled, the second transmission gate 16, the third inverter transmission gate 26, and the fourth inverter transmission gate 30 controlled by the first control signal "SW" are respectively disabled, disabled, and enabled. The second inverter transmission gate 20 controlled by the second power gating signal "pgb" is enabled. Therefore, the state of the non-CSI SRGP cell 70 is still held in the second latch 18.

During time 5, the power keeps on, the clock signal "clk" is in logic high, and the second power gating signal is de-asserted low. Thus, the first control signal "SW" is in logic high. The non-CSI SRGP cell 10 recovers a normal mode. The input control circuit 12 controlled by the clock signal "clk" is disabled, the second transmission gate 16, the third inverter transmission gate 26, and the fourth inverter transmission gate 30 controlled by the first control signal "SW" are respectively enabled, enabled, and disabled. The second inverter transmission gate 20 controlled by the second power gating signal "pgb" is disabled. Therefore, the state fed from the second latch 16 will be held in the first latch 14.

The present invention optimizes the current SRPG cells, especially, the current CSI SRPG cells. The improved SRPG cells can achieve the same functions but eliminating several elements, such as the NOR gate and inverter, and thus, reduce the die area, power consumption, clock load, improve the setup/hold time margin variations, and are contention-free.

While various embodiments of the present invention have been illustrated and described, it will be clear that the present invention is not limited to these embodiments. Numerous modifications, changes, variations, substitutions, and equivalents will be apparent to those skilled in the art, without departing from the spirit and scope of the present invention, as described in the claims.

The invention claimed is:

1. A clock state independent (CSI) state retention power gated (SRPG) cell, comprising:
    an input control circuit that receives an input signal, wherein the input control circuit comprises a plurality of transistors configured as a first inverter transmission gate, and at least one transistor serially connected to the plurality of transistors that is controlled by at least one power gating signal, wherein the input control circuit comprises first and second P-channel transistors, and first, second and third N-channel transistors, wherein the second P-channel transistor, the first P-channel transistor, the first N-channel transistor, the second N-channel transistor and the third N-channel transistor are sequentially series connected;
    a first latch having an input coupled to an output of the input control circuit;
    a transmission gate having an input coupled to an output of the first latch, wherein an output of the transmission gate comprises at least one output of the SRPG cell;
    a second latch having an input coupled to the output of the transmission gate, wherein an output of the second latch comprises at least one output of the SRPG cell; and
    a second inverter transmission gate having an input coupled to the output of the second latch and an output coupled to the first latch.

2. The CSI SRPG cell of claim 1, wherein the first inverter transmission gate is controlled by at least one control signal obtained by a logical operation of a clock signal and the at least one power gating signal.

3. The CSI SRPG cell of claim 1, wherein the input control circuit further comprises:
    a third P-channel transistors series connected to the second P-channel transistor.

4. The CSI SRPG cell of claim 3, wherein,
    the gate of the first P-channel transistor is coupled to receive a first control signal, and the gate of the first N-channel transistor is coupled to receive a second control signal that is a complement of the first control signal;
    the gate of the third P-channel transistor is coupled to receive a first power gating signal, and the gate of the third N-channel transistor is coupled to receive a second power gating signal that is a complement of the first power gating signal; and
    the gates of the second P-channel and N-channel transistors are coupled to receive the input signal.

5. The CSI SRPG cell of claim 4, wherein the first control signal is obtained by a logic AND operation of the clock signal and the second power gating signal.

6. The CSI SRPG cell of claim 1, wherein,
    the gate of the first P-channel transistor is coupled to receive a first control signal, and the gate of the first N-channel transistor is coupled to receive a second control signal that is a complement of the first control signal;
    the gate of the third N-channel transistor is coupled to receive a second power gating signal; and
    the gates of the second P-channel transistor and the second N-channel transistor are coupled to receive the input signal.

7. A non-clock state independent (CSI) state retention power gated (SRPG) cell, comprising:
    an input control circuit that receives an input signal, wherein the input control circuit is a first transmission gate controlled by a clock signal, wherein the input control circuit comprises first and second P-channel transistors, and first, second and third N-channel transistors, wherein the second P-channel transistor, the first P-channel transistor, the first N-channel transistor, the second N-channel transistor and the third N-channel transistor are sequentially series connected;
a first latch having an input coupled to an output of the input control circuit;
a second transmission gate having an input coupled to an output of the first latch, wherein an output of the second transmission gate comprises at least one output of the SRPG cell;
a second latch having an input coupled to the output of the second transmission gate, wherein an output of the second latch comprises at least one output of the SRPG cell; and
an inverter transmission gate (20) having an input coupled to the output of the second latch and an output coupled to an input of the first latch.

8. The SRPG cell of claim 7, wherein for a positive edge clock triggered SRPG cell, the clock signal is held high during assertion/de-assertion of a power gating signal, and the input control circuit is disabled.

9. The SRPG cell of claim 7, wherein for a negative edge clock triggered SRPG cell, the clock signal is held low during assertion/de-assertion of a power gating signal, and the input control circuit is disabled.

10. A method of controlling a state retention power gated (SRPG) cell, comprising:
controlling an input control circuit using only a clock signal, wherein the input control circuit receives an input signal and wherein the input control circuit is a first transmission gate, wherein the input control circuit comprises first and second P-channel transistors, and first, second and third N-channel transistors, wherein the second P-channel transistor, the first P-channel transistor, the first N-channel transistor, the second N-channel transistor and the third N-channel transistor are sequentially series connected;
controlling a first latch using a control signal, wherein the first latch has an input coupled to an output of the input control circuit;
controlling a second transmission gate using the control signal, wherein the second transmission gate has an input coupled to an output of the first latch and an output that comprises at least one output of the SRPG cell;
controlling a second latch using the control signal, wherein the second latch has an input coupled to the output of the second transmission gate and an output that comprises at least one output of the SRPG cell; and
controlling an inverter transmission gate using a power gating signal, wherein the inverter transmission gate has an input coupled to the output of the second latch, and an output coupled to the input of the first latch.

11. The control method of claim 10, wherein for a positive edge-clock-triggered non-CSI SRPG cell, the clock signal is held high during assertion/de-assertion of the power gating signal, and the input control circuit is disabled.

12. The control method of claim 10, wherein for a negative edge, clock-triggered non-CSI SRPG cell, the clock signal is held low during assertion/de-assertion of the power gating signal, and the input control circuit is disabled.

13. The control method of claim 10, wherein the control signal is obtained by a logic AND operation of the clock signal and the power gating signal.

\* \* \* \* \*

UNITED STATES PATENT AND TRADEMARK OFFICE
CERTIFICATE OF CORRECTION

PATENT NO.       : 8,816,741 B2
APPLICATION NO.  : 13/965202
DATED            : August 26, 2014
INVENTOR(S)      : Yifeng Liu et al.

It is certified that error appears in the above-identified patent and that said Letters Patent is hereby corrected as shown below:

On the Title Page, item (72), "Shayang Zhang" should be changed to be --Shayan Zhang--.

Signed and Sealed this
Twenty-eighth Day of April, 2015

Michelle K. Lee
*Director of the United States Patent and Trademark Office*